(12) United States Patent
Getty et al.

(10) Patent No.: US 7,842,223 B2
(45) Date of Patent: Nov. 30, 2010

(54) PLASMA PROCESS FOR REMOVING EXCESS MOLDING MATERIAL FROM A SUBSTRATE

(75) Inventors: James D. Getty, Vacaville, CA (US); Jiangang Zhao, Concord, CA (US)

(73) Assignee: Nordson Corporation, Westlake, OH (US)

( * ) Notice: Subject to any disclaimer, the term of this patent is extended or adjusted under 35 U.S.C. 154(b) by 1522 days.

(21) Appl. No.: 11/021,341

(22) Filed: Dec. 22, 2004

(65) Prior Publication Data

US 2006/0131790 A1 Jun. 22, 2006

(51) Int. Cl.
*B23K 26/38* (2006.01)
*H01S 3/00* (2006.01)
*C23F 1/00* (2006.01)
*B29C 35/08* (2006.01)

(52) U.S. Cl. .................. 264/400; 216/67; 257/E21.502

(58) Field of Classification Search ........................ None
See application file for complete search history.

(56) References Cited

U.S. PATENT DOCUMENTS

| | | | | |
|---|---|---|---|---|
| 5,208,067 A * | 5/1993 | Jones et al. ................. | 427/97.3 |
| 5,297,897 A | 3/1994 | Venrooij et al. ............. | 425/116 |
| 5,529,636 A | 6/1996 | Nohara et al. | |
| 5,961,860 A | 10/1999 | Lu et al. ................. | 219/121.65 |
| 6,082,375 A | 7/2000 | Gealy et al. .................. | 134/1.1 |
| 6,150,074 A * | 11/2000 | Shimoto et al. ............. | 430/314 |
| 6,230,719 B1 * | 5/2001 | Wensel ........................ | 134/1.1 |
| 6,417,028 B2 * | 7/2002 | Wensel ........................ | 438/112 |
| 6,576,867 B1 | 6/2003 | Lu et al. ................. | 219/121.69 |
| 6,629,880 B1 | 10/2003 | Kang et al. ................... | 451/59 |
| 6,632,746 B2 * | 10/2003 | Kanegae et al. ............. | 438/706 |
| 6,652,799 B2 | 11/2003 | Seng et al. ................... | 264/511 |
| 6,750,082 B2 | 6/2004 | Briar et al. ................... | 438/108 |
| 6,815,362 B1 * | 11/2004 | Wong et al. ................. | 438/706 |
| 7,028,696 B2 * | 4/2006 | Richardson et al. .......... | 134/1.1 |
| 7,282,452 B2 * | 10/2007 | Kanegae et al. ............. | 438/706 |
| 2001/0012681 A1 * | 8/2001 | Wensel ....................... | 438/584 |
| 2001/0032706 A1 * | 10/2001 | Wensel ....................... | 156/345 |
| 2003/0000546 A1 * | 1/2003 | Richardson et al. .......... | 134/1.1 |

(Continued)

FOREIGN PATENT DOCUMENTS

WO WO8607492 12/1986

OTHER PUBLICATIONS

Austrian Patent Office, Search Report issued in corresponding Singapore Application No. 200703593-4 dated as mailed Jul. 7, 2009.

(Continued)

*Primary Examiner*—Allan Olsen
(74) *Attorney, Agent, or Firm*—Wood, Herron & Evans, LLP

(57) ABSTRACT

A method for removing thin layers of a two-component molding material from areas on a substrate. The method includes using a plasma formed using a first gas mixture for removing one component of the molding material and a plasma formed using a different second gas mixture for removing the other component of the molding material. For filled epoxies commonly used as molding materials, the first gas mixture may be an oxygen-rich mixture of an oxygen-containing gas species and a fluorine-containing gas species, and the second gas mixture may be a fluorine-rich mixture of the same gases.

10 Claims, 1 Drawing Sheet

U.S. PATENT DOCUMENTS

| | | | |
|---|---|---|---|
| 2003/0005943 A1* | 1/2003 | Singh et al. | 134/1.1 |
| 2003/0045025 A1 | 3/2003 | Coyle et al. | 438/106 |
| 2003/0127502 A1 | 7/2003 | Alvarez | 228/246 |
| 2003/0193091 A1 | 10/2003 | Yu et al. | 257/773 |
| 2004/0053445 A1 | 3/2004 | Briar et al. | 438/108 |
| 2004/0106234 A1 | 6/2004 | Sorg et al. | 438/123 |
| 2004/0235303 A1* | 11/2004 | Wong et al. | 438/689 |
| 2005/0221599 A1* | 10/2005 | Kanegae et al. | 438/619 |
| 2005/0287815 A1* | 12/2005 | Lai et al. | 438/710 |
| 2006/0118239 A1* | 6/2006 | Condrashoff et al. | 156/345.3 |
| 2006/0130873 A1* | 6/2006 | Richardson et al. | 134/1.1 |
| 2006/0163201 A1* | 7/2006 | Getty et al. | 216/67 |
| 2006/0201910 A1 | 9/2006 | Getty et al. | |

OTHER PUBLICATIONS

Getty et al., "Critical Plasma Processing Parameters for Improved Strength of Wire Bonds", 2000 Nordson Corporation (6 pages).

March Plasma Systems, "Plasma Applications in the Printed Circuit Industry", 2000 (3 pages).

Fierro et al., "Plasma Processes", article reprinted from the Mar. 2003 issue of Circuitree (4 pages).

* cited by examiner

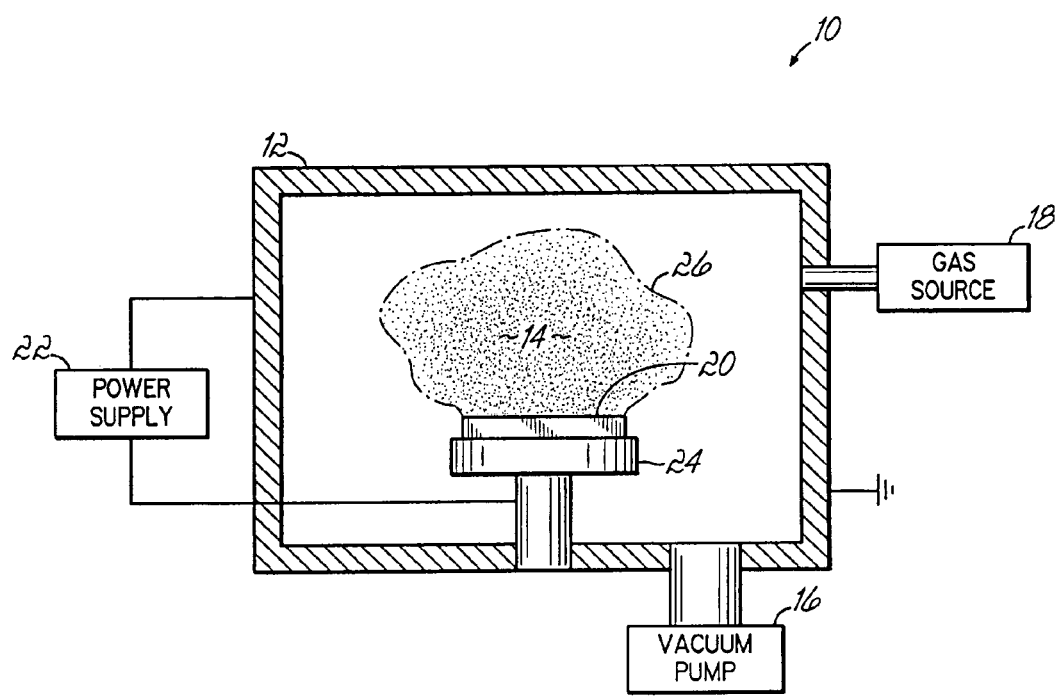

PLASMA PROCESS FOR REMOVING EXCESS MOLDING MATERIAL FROM A SUBSTRATE

FIELD OF THE INVENTION

The invention relates generally to plasma processing, and more particularly to a plasma treatment process for removing thin layers of excess molding material from a substrate.

BACKGROUND OF THE INVENTION

The surface properties of substrates used in applications relating to integrated circuits, electronic packages, and printed circuit boards are commonly modified by plasma treatment. In particular, plasma treatment is used in electronics packaging, for example, to increase surface activation and/or surface cleanliness for eliminating delamination and bond failures, improving wire bond strength, ensuring void free underfilling of chips on circuit boards, removing oxides, enhancing die attach, and improving adhesion for die encapsulation. Typically, one or more substrates are placed in a plasma treatment system and at least one surface of each substrate is exposed to the plasma. The outermost atomic layers may be removed from the surface by physical sputtering, chemically-assisted sputtering, chemical reactions promoted by reactive plasma species, and combinations of these mechanisms. The physical or chemical action may also be used to condition the surface to improve properties such as adhesion or to clean undesired contaminants from the substrate surface.

During semiconductor manufacture, semiconductor die are commonly electrically coupled by wire bonds with leads on a metal carrier, such as a lead frame. Lead frames generally include a number of pads each having exposed leads used to electrically couple a single semiconductor die with a circuit board. One semiconductor die is attached to each pad and external electrical contacts of the die are wire bonded with nearby portions of the leads.

Each semiconductor die and its wire bonds are encapsulated inside a package consisting of a molded polymer body designed to protect the semiconductor die and wire bonds from the adverse environment encountered during handling, storage and manufacturing processes as well as to dissipate the heat generated from the semiconductor die during operation. A common molding material used to fabricate such packages is an epoxy resin filled with silica or silicon particles.

During the molding process, the lead frame and the multiple attached semiconductor die are positioned between two mold halves. One mold half includes numerous cavities each receiving one of the semiconductor die and defining the package shape. The mold halves are pressed together in an attempt to seal the entrance mouths to the cavities. The molding material, which is injected into the mold, fills the open space inside the cavities for encapsulating the semiconductor die and wire bonds. However, molding material can seep out of the cavities between the mold halves and form thin layers or flash on the exposed leads. This thin flash has a thickness typically less than about 10 microns. Flash is detrimental as it may affect the ability to make high quality electrical connections with the encapsulated semiconductor die.

Flash may be prevented during the molding process by covering the backside of the lead frame with tape. However, adhesive may be transferred from the tape to the lead frame backside and remain as a residue after the tape is removed. In addition, tapes suitable for this application are relatively expensive, which adds to the cost of manufacture. Flash may be removed after molding by mechanical and chemical techniques, or with a laser. These removal approaches also suffer from deficiencies that restrict their use. For example, the lead frame is susceptible to damage from mechanical flash removal techniques, such as chemical mechanical polishing. Chemical processes may be ineffective unless highly corrosive chemicals are used, which potentially raises issues of worker safety and waste disposal of the spent corrosive chemicals. Laser removal is expensive and leaves a residual carbon residue behind on the lead frame.

There is thus a need for a plasma treatment process that can efficiently and effectively remove excess molding material from a substrate.

SUMMARY OF THE INVENTION

The present invention addresses these and other problems associated with conventional flash removal processes. To that end, a method for removing amounts of two-component molding material from an area on a substrate comprises exposing the substrate to a first plasma effective to remove a first component of the molding material from the area with a higher etch rate than a second component of the molding material. The method further includes exposing the substrate to a second plasma effective to remove the second component of the molding material from the area with a higher etch rate than the first component of the molding material.

In another embodiment of the invention, a method for removing amounts of a two-component molding material from an area on a substrate includes generating a first plasma formed from a first gas mixture including a lower concentration by volume of a fluorine-containing gas species than an oxygen-containing gas species and exposing the substrate to the first plasma to remove a first component of the molding material from the area with a higher etch rate than a second component of the molding material. The method further includes generating a second plasma formed from a second gas mixture including a higher concentration by volume of the fluorine-containing gas species than the oxygen-containing gas species and then exposing the substrate to the second plasma to remove the second component of the molding material from the area at a higher etch rate than the first component of the molding material.

These and other objects and advantages of the present invention shall become more apparent from the accompanying drawings and description thereof.

BRIEF DESCRIPTION OF THE FIGURES

The accompanying drawing, which is incorporated in and constitutes a part of this specification, illustrates an embodiment of the invention and, together with a general description of the invention given above, and the detailed description given below, serves to explain the principles of the invention.

The FIGURE is a diagrammatic view of a plasma treatment system for plasma treating substrates in accordance with the principles of the present invention.

DETAILED DESCRIPTION OF THE PREFERRED EMBODIMENTS

With reference to the FIGURE, a plasma treatment system 10 includes a treatment chamber 12 constituted by walls that enclose a processing space 14. During plasma processing, the treatment chamber 12 is sealed fluid-tight from the surrounding ambient environment. The treatment chamber 12 includes an access opening (not shown) configured for a transferring substrate 20 to and from the processing space 14. A vacuum pump 16 used to evacuate the processing space 14 of treatment chamber 12 may comprise one or more vacuum pumps with controllable pumping speeds as recognized by persons of ordinary skill in the art of vacuum technology. Process gas is admitted to the processing space 14 from a process gas source 18 through an inlet port defined in the treatment chamber 12 at a predetermined flow rate. The flow of process gas from the process gas source 18 to the processing space 14 is typically metered by a mass flow controller (not shown). The flow rate of gas from the process gas source 18 and the pumping rate of vacuum pump 16 are adjusted to provide a processing pressure and environment suitable for plasma generation. Processing space 14 is continuously evacuated simultaneously as process gas is introduced from the process gas source 18 so that fresh gases are continuously exchanged within the processing space 14 when the plasma is present.

A power supply 22 is electrically coupled with, and transfers electrical power to, an electrode pedestal 24 inside of the treatment chamber 12, which supports substrate 20 in the exemplary treatment system 10. Power transferred from the power supply 22 is effective for forming a plasma 26 proximate to the substrate 20 from the process gas confined within processing space 16 and also controls the direct current (DC) self-bias. Although the invention is not so limited, the power supply 22 may be a radio-frequency (RF) power supply operating at a frequency between about 40 kHz and about 13.56 MHz, preferably about 13.56 MHz although other frequencies may be used, and a power level, for example, between about 4000 watts and about 8000 watts at 40 kHz or 300 watts to 2500 watts at 13.56 MHz. However, those of ordinary skill in the art will appreciate that different treatment chamber designs may permit different bias powers. A controller (not shown) is coupled to the various components of the plasma treatment system 10 to facilitate control of the etch process.

Plasma treatment system 10 may assume different configurations understood by those of ordinary skill in the art and, therefore, is not limited to the exemplary configuration described herein. For example, the plasma 26 may be generated remote of treatment chamber 12 and delivered to the processing space 14 for use in plasma treating substrate 20. Plasma treatment system 10 is further understood to include components not shown in the FIGURE necessary for operation of system 10, such as a gate valve disposed between the processing space 14 and the vacuum pump 16.

Substrate 20 is positioned in the processing space 14 of treatment chamber 12 at a location suitable for plasma treatment. The invention contemplates that multiple substrates 20 may be positioned inside treatment chamber 12 and treated simultaneously with the plasma 26 provided in processing space 14 by a single treatment process.

The plasma treatment of substrate 20 efficiently and effectively removes thin layers of molding material (i.e., flash) disposed on areas of the substrate 20. The flash-covered areas may be created by a molding process during a previous manufacturing stage. For example, these areas of extraneous molding material may reside on electrical contacts for a semiconductor die encapsulating inside a molded polymer package. A common molding material is a composite consisting of an organic matrix, like polymer or epoxy, and an inorganic filler, like silica particles, dispersed in the matrix for modifying a property of the organic matrix.

The plasma treatment of substrate 20 is a two stage process based upon the premise that the etch selectivity and etch rate of the organic matrix and the inorganic filler constituting the molding material differ under equivalent plasma conditions. The use of two distinct process stages accelerates flash removal as the first stage is adapted to efficiently remove the organic matrix selectively to the inorganic filler and the second stage is adapted to efficiently remove the inorganic filler selectively to the organic matrix. One approach for providing these two process stages is to vary the composition of the gas mixture from which the plasma is formed.

In the first stage of the process, the substrate 20 in processing space 14 is exposed to a plasma 26 formed from an oxygen-rich gas mixture including a fluorine-containing gas species (e.g., carbon tetrafluoride, nitrogen trifluoride, or sulfur hexafluoride) and an oxygen-containing gas species, like oxygen ($O_2$). Although not wished to be bound by theory, it is believed that active species (e.g., radicals and ions) of oxygen from the plasma 26 are relatively effective for removing the organic matrix in the areas on substrate 20 covered by the thin layer of molding material. Similarly, it is believed that active species of fluorine originating from the plasma 26 are relatively effective for removing the inorganic filler of the molding material. By forming the plasma 26 from an oxygen-rich gas mixture, the etch rate for the organic matrix is greater than the etch rate for the inorganic filler. In other words, the organic matrix is removed selective to the inorganic filler.

As described above, the concentration by volume of the oxygen-containing gas species in the gas mixture of the first process stage is greater than the concentration by volume of the fluorine-containing gas species. As a result, the gas mixture for the first process stage includes the oxygen-containing gas species at a concentration of more than 50 percent by volume (vol %). The fluorine-containing gas species typically comprises the balance of the gas mixture, although other gas species like an inert gas may be deliberately added to the gas mixture so long as the oxygen-containing gas species has a greater concentration than the fluorine-containing species. Of course, residual atmospheric gases and out-gassing from chamber components also contribute partial pressures to the partial vacuum inside treatment chamber 12. Gas mixtures most suitable for use in the first process stage include about 70 vol % to about 90 vol % of the oxygen-containing gas species. A gas mixture found to be particularly suitable for this initial process stage of the process is 80 vol % of the oxygen-containing gas species and 20 vol % of the fluorine-containing gas species.

Active species of oxygen present in the plasma 26 of the first stage efficiently remove the organic matrix in the areas on substrate 20 covered by the thin layer of molding material. Although active species of fluorine remove the inorganic filler in these flash-covered areas, the recipe of the first stage is relatively inefficient for removing the inorganic filler due to the relatively low etch rate for this component of the molding material. As a result, after the organic matrix is substantially or partially removed from the spaces between the filler, residual inorganic filler remains across areas of substrate 20 formerly covered by flash. The invention contemplates that because the second stage also removes the organic matrix, albeit with a significantly lower etch rate, the organic matrix does not have to be completely removed during the first stage of the treatment process and may be partially removed by the second process stage. Of course, the two process stages may be iterated for flash removal, if required.

In a second process stage of the treatment process, the substrate 20 in processing space 14 is exposed to a plasma 26 generated from a fluorine-rich gas mixture of a fluorine-containing species (e.g., carbon tetrafluoride, nitrogen trifluoride, or sulfur hexafluoride) and an oxygen-containing gas species, like oxygen ($O_2$). The plasma 26 formed from this gas mixture has an elevated etch rate for the inorganic filler relative to the etch rate for the organic matrix, as compared with the first process stage. Typically, the change in the gas mixture is accomplished without breaking vacuum and, preferably, without extinguishing the plasma 26 inside treatment chamber 12. This second gas mixture may include the same two gas species as the first stage but mixed in different relative proportions.

Generally, the concentration by volume of the oxygen-containing gas species in the gas mixture is smaller than the concentration by volume of the fluorine-containing gas species. Typically, the gas mixture for the second stage includes less than 50 vol % of the oxygen-containing gas species and the balance of the mixture comprises the fluorine-containing gas species. However, other gas species like an inert gas may be deliberately added to the gas mixture so long as the oxygen-containing gas species has a smaller concentration than the fluorine-containing species. Gas mixtures most suitable for use in the second process stage comprise about 70 vol % to about 90 vol % of the fluorine-containing gas species. A gas mixture found to be particularly suitable for this stage of the process is 20 vol % of the oxygen-containing gas species and 80 vol % of the fluorine-containing gas species.

The active species in the plasma 26 generated from the fluorine-rich gas mixture of the latter process stage remove the residual inorganic filler more efficiently than the plasma 26 generated from the oxygen-rich gas mixture of the first process stage. As a result, the overall process time required to remove flash from the affected areas on the substrate 20 is reduced as compared with a one stage process using only a single gas mixture that has a higher etch rate for only one component of the molding material. This overall reduction in process time contributed by the two stage process of the invention significantly increases system throughput.

Portions of the substrate 20 susceptible to plasma damage may be covered during the plasma treatment to prevent or significantly reduce plasma exposure. The exposure time for each of the stages will depend upon, among other variables, the plasma power, the properties of the treatment chamber 12, and the characteristics of the flash, such as thickness. The etch rate and process uniformity will be contingent upon plasma parameters, including but not limited to input power, system pressure, and processing time.

The present invention overcomes the various deficiencies of conventional removal techniques as thin areas of molding material are removed without resort to wet chemical etching techniques, mechanical techniques, or the use of a laser. The process recipe of the invention is particularly applicable for removing unwanted thin layers of molding material or flash covering the electrical contacts of a lead frame. These thin layers result from the molding process encapsulating die carried by the lead frame inside respective packages constituted by the molding material.

In use and with reference to the FIGURE, the substrate 20 is positioned in the processing space 14 inside the treatment chamber 12 at a location suitable for plasma processing. The processing space 14 is then evacuated by vacuum pump 16. During both process stages, a flow of process gas is introduced from process gas source 18 to raise the partial vacuum in the treatment chamber 12 to a suitable operating pressure, typically in the range of about 150 mTorr to about 2500 mTorr and preferably in the range of about 800 mTorr to 2500 mTorr for providing an enhanced etch rate, while actively evacuating the processing space 14 with vacuum pump 16. The power supply 22 is energized for supplying electrical power to the electrode pedestal 24, which generates plasma 26 in the processing space 14 proximate to the substrate 20 and DC self-biases the electrode pedestal 24.

The substrate 20 is exposed to the plasma in a two-stage treatment process for individual stage exposure times sufficient for removing the excess molding material in the form of flash from areas on the substrate 20. Specifically, the substrate 20 is exposed to a first plasma generated from the oxygen-rich gas mixture of an oxygen-containing gas species and a fluorine-containing gas species for a duration sufficient to substantially remove the organic matrix of the flash. During this first stage, the etch rate for the organic matrix is greater than the etch rate for the inorganic filler. Then, the substrate 20 is exposed to a second plasma generated from the fluorine-rich gas mixture of an oxygen-containing gas species and a fluorine-containing gas species for a duration sufficient to substantially remove the inorganic filler of the flash. During this second stage, the etch rate for the inorganic filler is greater than the etch rate for the organic matrix.

The substrate 20 may be exposed to the first and second plasmas 26 without removing the substrate 20 from the treatment chamber 12 (i.e., without extinguishing the plasma as the process gas mixture is changed). Preferably, the substrate 20 remains in the same treatment position during both stages of the treatment process. The two process stages may be iterated or repeated as needed to accomplish flash removal, which may be contingent upon the flash thickness. The plasma 26 is extinguished after the completion of the second stage of the treatment process. However, there may be additional plasma processing steps unrelated to flash removal either before or after the power is turned off.

Further details and embodiments of the invention will be described in the following example.

EXAMPLE

A lead frame carrying a number of molded packages and with flash observable on the electrical leads of the lead frame was treated with a two-stage plasma process in accordance with the present invention. The molding material used to fabricate the packages was a silica-filled epoxy. The first process stage used a gas mixture, measured in terms of flow rate into the plasma chamber, of $CF_4$ (80 sccm) and $O_2$ (320 sccm) to form a plasma at a chamber pressure of 400 mTorr. The lead frame was exposed to the plasma for approximately five (5) minutes. The plasma power was about 500 watts at an operating frequency of 13.56 MHz. Upon inspection of the lead frame, the first stage was observed to effectively remove the epoxy in the thin areas.

After the epoxy was removed, the silica filler remained behind on the lead frame as a residue. With the lead frame still inside the treatment chamber and without extinguishing the plasma or breaking vacuum, the gas mixture was transitioned to conform with a second stage of the treatment process. The second stage then used a gas mixture of $CF_4$ (240 sccm) and $O_2$ (60 sccm), which again resulted in a chamber pressure of 400 mTorr. The lead frame was exposed to this plasma for approximately five (5) minutes. The plasma power was about 500 watts at an operating frequency of 13.56 MHz. Following this stage of the treatment, the silica filler was removed and the lead frame was observed to be substantially free of flash.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims, Wherein we claim:

1. A method for removing two-component molding material from an area on a substrate placed within a treatment chamber, the two component molding material containing an organic matrix and a plurality of silica particles dispersed in the organic matrix, the method comprising:
    placing the substrate within the treatment chamber;
    introducing a first gas mixture containing less than 50 percent by volume of a fluorine-containing gas species and an oxygen-containing gas species into the treatment chamber at an operating pressure in the range of about 800 mTorr to about 2500 mTorr;
    forming a plasma in the treatment chamber from the first gas mixture;
    exposing the substrate to the plasma generated from the first gas mixture to remove the organic matrix from the area and leave the plurality of silica particles;
    without removing the substrate from the treatment chamber and without extinguishing the plasma in the treatment chamber, changing from the first gas mixture to a second gas mixture containing more than 50 percent by volume of the fluorine-containing gas species and the oxygen-containing gas species at an operating pressure in the range of about 800 mTorr to about 2500 mTorr;
    forming a plasma in the treatment chamber from the second gas mixture; and
    exposing the substrate to the plasma generated from the second gas mixture to remove the plurality of silica particles from the area.

2. The method of claim 1 wherein the fluorine-containing gas species is selected from the group consisting of carbon tetrafluoride, nitrogen trifluoride, and sulfur hexafluoride.

3. The method of claim 1 wherein the oxygen-containing gas species is molecular oxygen.

4. The method of claim 1 wherein the organic matrix is an epoxy.

5. The method of claim 1 wherein the second gas mixture contains about 70 percent by volume to about 90 percent by volume of the fluorine-containing gas species.

6. The method of claim 1 wherein the second gas mixture contains about 80 percent by volume of the fluorine-containing gas species and about 20 percent by volume of the oxygen-containing gas species.

7. The method of claim 1 wherein the first gas mixture contains about 70 percent by volume to about 90 percent by volume of the oxygen-containing gas species.

8. The method of claim 7 wherein the second gas mixture contains about 70 percent by volume to about 90 percent by volume of the fluorine-containing gas species.

9. The method of claim 1 wherein the first gas mixture contains about 80 percent by volume of the oxygen-containing gas species and about 20 percent by volume of the fluorine-containing gas species.

10. The method of claim 9 wherein the second gas mixture contains about 80 percent by volume of the fluorine-containing gas species and about 20 percent by volume of the oxygen-containing gas species.

* * * * *